United States Patent
Yuge

(10) Patent No.: US 10,813,257 B2
(45) Date of Patent: Oct. 20, 2020

(54) ELECTROMAGNETIC WAVE ABSORBING MATERIAL

(71) Applicant: NEC CORPORATION, Tokyo (JP)

(72) Inventor: Ryota Yuge, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 16/330,276

(22) PCT Filed: Apr. 27, 2017

(86) PCT No.: PCT/JP2017/016751
§ 371 (c)(1),
(2) Date: Mar. 4, 2019

(87) PCT Pub. No.: WO2018/042757
PCT Pub. Date: Mar. 8, 2018

(65) Prior Publication Data
US 2019/0208676 A1    Jul. 4, 2019

(30) Foreign Application Priority Data

Sep. 5, 2016    (JP) .................................. 2016-172627

(51) Int. Cl.
*H05K 9/00* (2006.01)
*C01B 32/18* (2017.01)
*B82Y 30/00* (2011.01)

(52) U.S. Cl.
CPC ............ *H05K 9/0088* (2013.01); *B82Y 30/00* (2013.01); *C01B 32/18* (2017.08); *H05K 9/00* (2013.01)

(58) Field of Classification Search
CPC .......... B82Y 30/00; C01B 32/18; H05K 9/00; H05K 9/0088
See application file for complete search history.

(56) References Cited

U.S. PATENT DOCUMENTS

| 7,296,576 B2 * | 11/2007 | Ait-Haddou ............. C08J 5/005 528/397 |
| 7,501,024 B2 * | 3/2009 | Azami ................... B82Y 30/00 117/109 |

(Continued)

FOREIGN PATENT DOCUMENTS

| EP | 2 769 966 A1 | 8/2014 |
| JP | 2008-235708 A | 10/2008 |
| WO | 2005/014475 A2 | 2/2005 |

OTHER PUBLICATIONS

Communication dated Jul. 18, 2019, from the European Patent Office in counterpart European Application No. 17845768.5.

(Continued)

*Primary Examiner* — Timothy J Thompson
*Assistant Examiner* — Rhadames Alonzo Miller
(74) *Attorney, Agent, or Firm* — Sughrue Mion, PLLC

(57) ABSTRACT

The electromagnetic wave absorbing material excellent in electrical conductivity and dispersibility and containing a carbon material suitable for an electromagnetic wave absorbing material is an electromagnetic wave absorbing material characterized by containing a fibrous carbon nanohorn aggregate composed of a plurality of single-walled carbon nanohorns gathering in a fibrous form, the fibrous carbon nanohorn aggregate contains single-walled carbon nanotubes inside, and by fabricating using a catalyst-containing carbon target containing a single body of Fe, Ni or Co or a mixture thereof, a fibrous carbon nanohorn aggregate including the metal contained in the target is obtained.

16 Claims, 6 Drawing Sheets

(56) References Cited

U.S. PATENT DOCUMENTS

| | | | | |
|---|---|---|---|---|
| 7,566,478 | B2* | 7/2009 | Ward | B82Y 10/00 427/249.1 |
| 7,659,224 | B2* | 2/2010 | Shimazaki | B01J 23/42 420/460 |
| 2002/0127351 | A1* | 9/2002 | Takikawa | B01J 19/088 427/569 |
| 2003/0188963 | A1* | 10/2003 | Takikawa | B82Y 40/00 204/164 |
| 2004/0048744 | A1* | 3/2004 | Iijima | B01J 20/20 502/416 |
| 2005/0029498 | A1* | 2/2005 | Elkovitch | B82Y 10/00 252/500 |
| 2005/0031525 | A1* | 2/2005 | Iijima | C01B 32/18 423/445 B |
| 2005/0038225 | A1* | 2/2005 | Charati | B82Y 10/00 528/272 |
| 2005/0070657 | A1* | 3/2005 | Elkovitch | B82Y 30/00 524/495 |
| 2005/0272856 | A1* | 12/2005 | Cooper | B82Y 30/00 524/496 |
| 2005/0284296 | A1* | 12/2005 | IIjima | B01J 20/20 96/108 |
| 2006/0165992 | A1* | 7/2006 | Iijima | B01J 20/0207 428/408 |
| 2007/0003469 | A1* | 1/2007 | Azami | C01B 32/18 423/445 R |
| 2007/0248758 | A1* | 10/2007 | Ward | B05D 1/002 427/271 |
| 2007/0265379 | A1* | 11/2007 | Chen | B82Y 30/00 524/404 |
| 2008/0281014 | A1* | 11/2008 | Momose | B29C 39/006 522/71 |
| 2008/0299307 | A1* | 12/2008 | Ward | B82Y 10/00 427/249.1 |
| 2009/0321688 | A1* | 12/2009 | Saitoh | B82Y 30/00 252/511 |
| 2010/0015475 | A1* | 1/2010 | Kurungot | H01M 4/8878 429/494 |
| 2010/0021097 | A1* | 1/2010 | Uchida | B65G 39/09 384/492 |
| 2010/0044584 | A1* | 2/2010 | Cooper | B82Y 30/00 250/459.1 |
| 2010/0065788 | A1* | 3/2010 | Momose | B82Y 30/00 252/511 |
| 2010/0075835 | A1* | 3/2010 | Yuge | B82Y 40/00 502/150 |
| 2010/0177462 | A1* | 7/2010 | Adzic | H01G 11/36 361/502 |
| 2010/0206504 | A1* | 8/2010 | Akiyama | D21H 15/12 162/181.9 |
| 2010/0329966 | A1* | 12/2010 | Fugetsu | B01F 17/0007 423/447.1 |
| 2011/0003151 | A1* | 1/2011 | Nishio | B01J 23/005 428/367 |
| 2011/0124253 | A1* | 5/2011 | Shah | B82Y 30/00 442/60 |
| 2012/0000691 | A1* | 1/2012 | Shah | B82Y 30/00 174/102 R |
| 2012/0077020 | A1* | 3/2012 | Muramatsu | B82Y 30/00 428/319.1 |
| 2012/0202060 | A1* | 8/2012 | Yuge | C01B 32/16 428/367 |
| 2013/0012655 | A1* | 1/2013 | Sakai | C08G 73/026 524/609 |
| 2013/0130049 | A1* | 5/2013 | Moilanen | C08L 63/00 428/532 |
| 2013/0316238 | A1* | 11/2013 | Nishimura | C22C 13/00 429/219 |
| 2014/0072504 | A1* | 3/2014 | Goino | B82Y 30/00 423/445 R |
| 2014/0203219 | A1* | 7/2014 | Nishijima | C08K 3/04 252/510 |
| 2014/0329076 | A1* | 11/2014 | Goino | B82Y 30/00 428/304.4 |
| 2014/0332728 | A1* | 11/2014 | Goino | C04B 38/00 252/478 |
| 2015/0132655 | A1* | 5/2015 | Yuge | H01M 4/362 429/232 |
| 2015/0298963 | A1* | 10/2015 | Takatsuka | B81B 3/0021 310/300 |
| 2016/0377409 | A1* | 12/2016 | Norisada | G01B 7/22 73/780 |
| 2017/0110735 | A1* | 4/2017 | Ito | H01M 4/8807 |
| 2017/0167928 | A1* | 6/2017 | Lee | D01D 5/0084 |
| 2017/0217841 | A1* | 8/2017 | Goino | C04B 38/00 |
| 2018/0105425 | A1* | 4/2018 | Yuge | B01J 21/18 |
| 2019/0048168 | A1* | 2/2019 | Takahashi | H02N 1/08 |
| 2019/0111409 | A1* | 4/2019 | Yuge | B01J 35/1023 |

OTHER PUBLICATIONS

Ryota Yuge et al., "Preparation and Chracterization of Newly Discovered Fibrous Aggregates of Single-Walled Carbon Nanohorns", Advanced Materials, May 25, 2016, pp. 7174-7177, vol. 28, No. 33.

Ryota Yuge et al., "Structure and Electrical Properties of Fibrous Aggregates of Carbon Nanohorns", the 63rd JSAP Spring Meeting 2016 [Koen Yokoshu], Mar. 3, 2016, p. 14-115, ISBN 978-4-86348-555-6.

International Search Report for PCT/JP2017/016751, dated Aug. 8, 2017.

* cited by examiner

FIG. 2
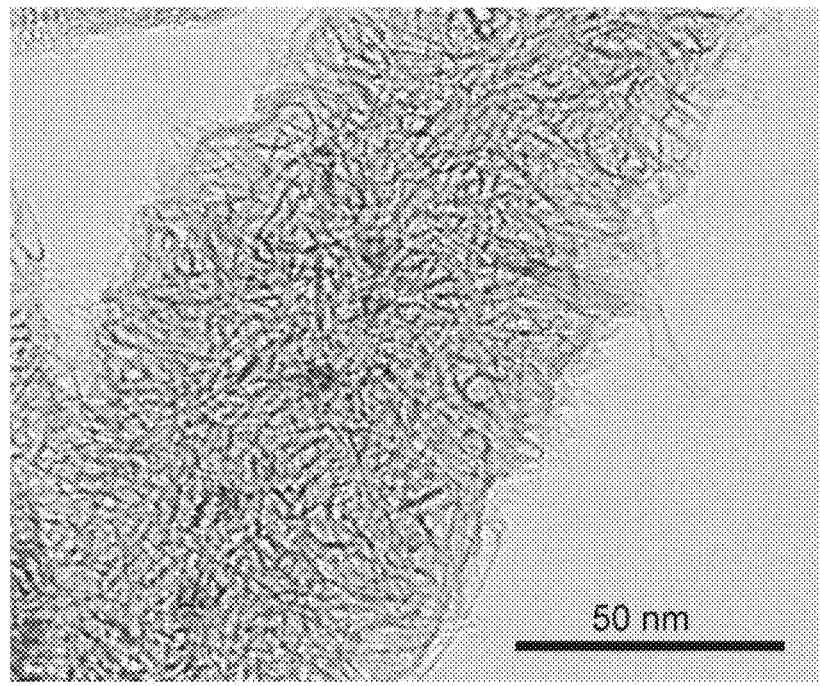
FIG. 3 (a)
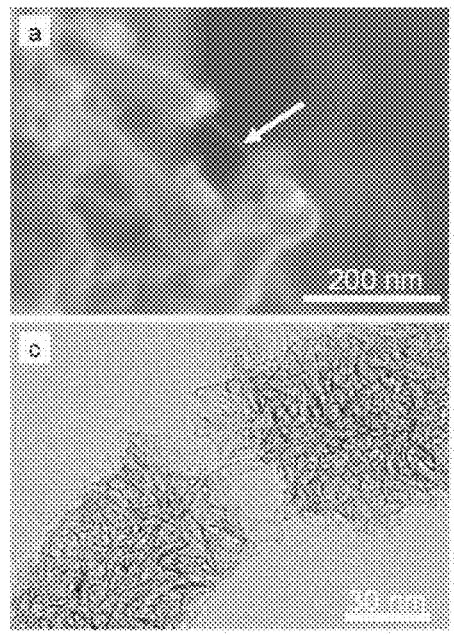
FIG. 3 (c)
FIG. 3 (b)
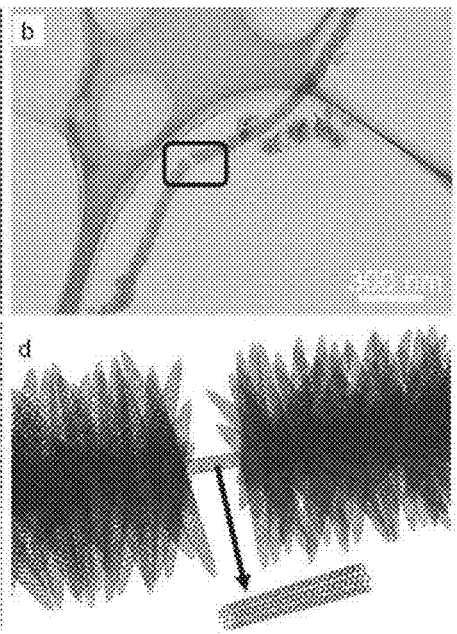
FIG. 3 (d)

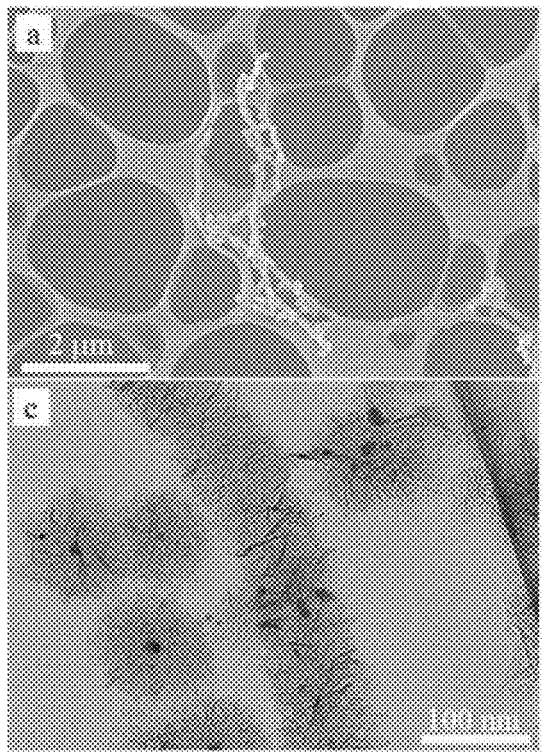
FIG. 9 (a)
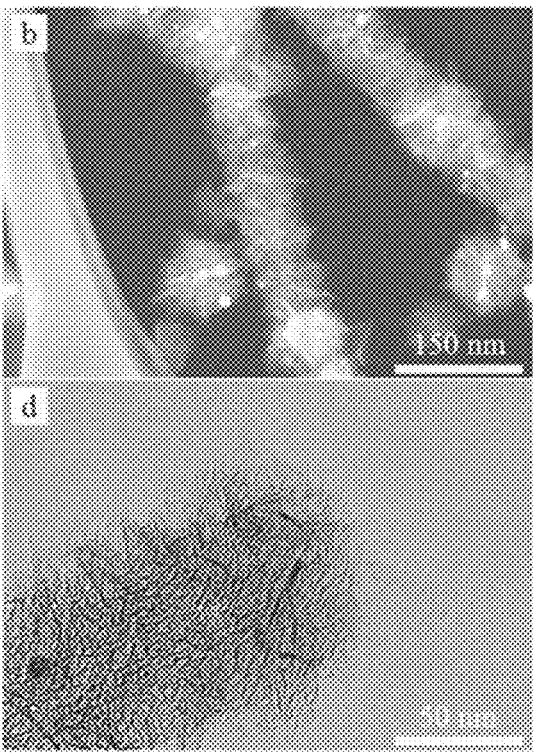
FIG. 9 (b)
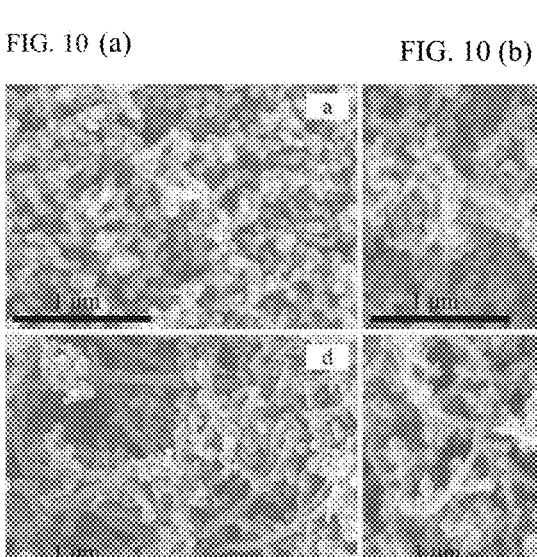
FIG. 9 (c)
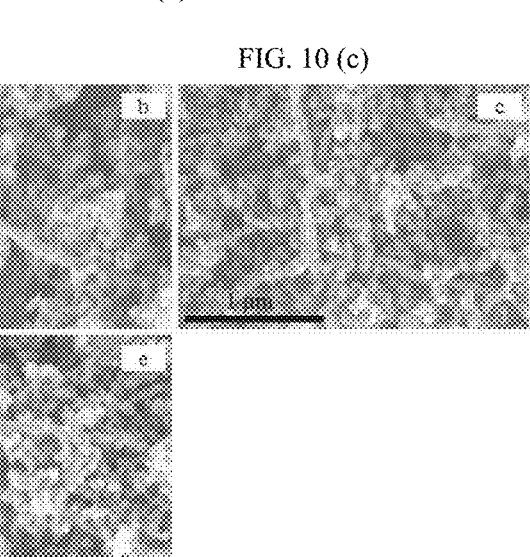
FIG. 9 (d)
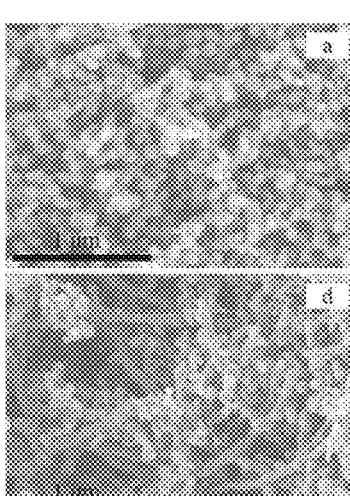
FIG. 10 (a)
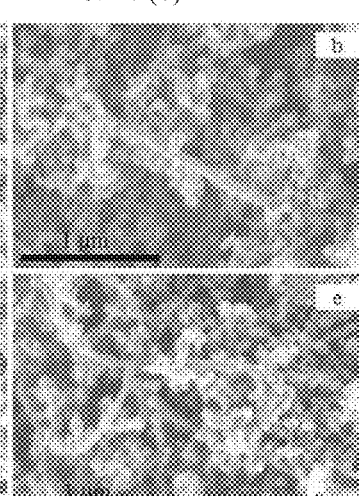
FIG. 10 (b)
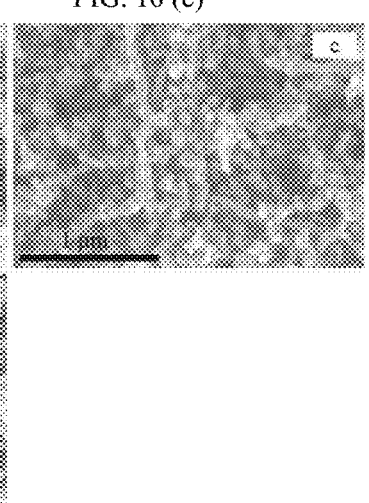
FIG. 10 (c)
Fig. 10 (d)
Fig. 10 (e)

ELECTROMAGNETIC WAVE ABSORBING MATERIAL

CROSS REFERENCE TO RELATED APPLICATIONS

This Application is a National Stage of International Application No. PCT/JP2017/016751 filed Apr. 27, 2017, claiming priority based on Japanese Patent Application No. 2016-172627 filed Sep. 5, 2016, the disclosure of which is herein incorporated in its entirety.

TECHNICAL FIELD

The present invention relates to an electromagnetic wave absorbing material containing a fibrous carbon nanohorn aggregate.

BACKGROUND ART

As carbon materials, there are nanocarbon materials having nano size such as carbon nanotubes, carbon nanohorns and the like. Features of their structures have attracted attention, and applications thereof have been studied intensively.

In recent years, miniaturization and higher frequency of electronic devices are advancing in the field of electronics, and resultantly, LSI and microprocessors and the like become to emit unnecessary noises more easily.

Furthermore, frequencies in the GHz band are also used for ETC (electronic toll collection) and AHS (advanced cruise-assist highway system) as advanced road traffic systems as well as high-speed communication networks using wireless LAN and optical fiber in the communication field, and it is expected that the range of high frequency use will further expand in the future. In addition, because of the recent lowering of noise margin due to low power consumption of electronic devices, and miniaturization of electronic devices, the noise environment in the device is further deteriorated, causing a problem of incorrect operations by EMI (Electro-Magnetic Interference).

As an electromagnetic wave absorber corresponding to the millimeter wave region, an electromagnetic wave absorber in which a carbon material such as carbon black particles or carbon fibers is dispersed in an electrically insulating organic material such as a rubber or a resin has been known. Further, as a magnetic body showing little decrease in magnetic permeability in the high frequency region and having an excellent electromagnetic wave absorption property up to the millimeter wave region, a magnetic body composed of magnetic material particles and a carbon structure material, which has a Young's modulus of at least 900 GPa or more and a Debye temperature of 900 K or more, and presents between the magnetic material particles, has been suggested (Patent Document 1). As the carbon structure material, it is said that one or more kinds selected from single-walled carbon nanotubes, multi-walled carbon nanotubes, carbon nanohorns and fullerenes can be used. Further, these magnetic material particles and the carbon structure are integrated by high-temperature sintering, or dispersed in a binder to form an electromagnetic wave absorbing material, wherein the binder is one kind or two or more kinds selected from an epoxy resin, a silicone resin, a polyester resin, a polyamide resin, an acrylic resin, a vinyl chloride resin, an ethylene-vinyl acetate copolymer and an ethylene-vinyl acetate-vinyl chloride graft copolymer.

PRIOR ART DOCUMENT

Patent Document

Patent Document 1: Japanese Unexamined Patent Application Publication No. 2008-235708

SUMMARY OF THE INVENTION

Problem to be Solved by the Invention

In the spherical carbon nanohorn aggregate, a single-walled carbon nanohorn gathers to form an aggregate of a spherical structure having a diameter of about 100 nm. Because of such a spherical structure, internal resistance tends to be higher in a mixture with a resin, as compared with needle-like carbon materials, for example, carbon materials having a needle-like structure such as carbon nanotubes and the like. This is because the carbon material having a needle-like structure can form a conductive path of about several micrometers so that the effect of imparting conductivity is large, whereas the carbon nanohorn aggregate having a spherical structure cannot form such a long conductive path. In contrast, the material with a needle-like structure has low dispersibility.

The present invention has an object of providing an electromagnetic wave absorbing material containing a carbon material suitable for an electromagnetic wave absorbing material.

Means for Solving the Problem

The electromagnetic wave absorbing material of the present invention contains a fibrous carbon nanohorn aggregate in which a plurality of single-walled carbon nanohorns gather in a fibrous form.

Effect of the Invention

The fibrous carbon nanohorn aggregate according to the present invention is excellent in both conductivity and dispersibility. Since the fibrous carbon nanohorn aggregate according to the present invention is produced by including a magnetic metal material as a catalyst contained in the catalyst-containing carbon target used at the time of production, it has electromagnetic wave absorptivity and is suitable as an electromagnetic wave absorbing material.

BRIEF DESCRIPTION OF THE DRAWINGS

FIG. 2 is a STEM photograph of a fibrous carbon nanohorn aggregate prepared according to one embodiment example.

FIG. 3(a) is a SEM photograph of a fibrous carbon nanohorn aggregate according to one embodiment example, FIG. 3(b) is a STEM photograph, FIG. 3(c) is a STEM photograph enlarging the square portion of FIG. 3(b), and FIG. 3(d) is an image view of FIG. 3(c).

FIG. 9(a) is a SEM photograph of a sample prepared when 5% by mass of Fe is contained in the carbon target, FIG. 9(b) shows Z contrast, FIG. 9(c) is a STEM photograph, and FIG. 9(d) is a STEM photograph with further increased magnification.

FIGS. 10(a)-10(e) show SEM photographs of a carbon nanohorn aggregate prepared when the content of Fe contained in a carbon target is FIG. 10(a) 0% by mass, FIG. 10(b) 0.5% by mass, FIG. 10(c) 1.5% by mass, FIG. 10(d) 5% by mass and FIG. 10(e) 15% by mass.

EXAMPLE EMBODIMENTS

Example embodiments of the present invention will be described below.

Figure 1:
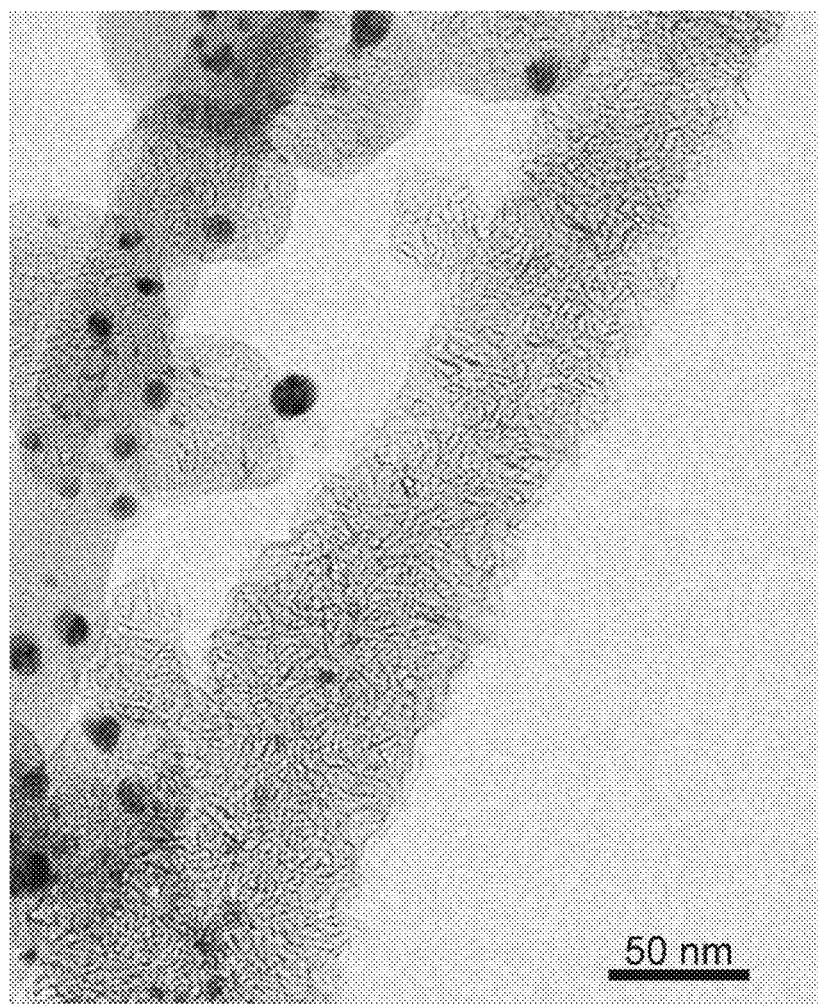
FIG. 1 is a scanning transmission electron microscope (STEM) photograph of a fibrous carbon nanohorn aggregate prepared according to one embodiment example.

FIGS. 1 and 2 are scanning transmission electron microscope (STEM) photographs of a fibrous carbon nanohorn aggregate according to one example embodiment of the present invention. The fibrous carbon nanohorn aggregate has a structure in which carbon nanohorn aggregates of a seed type, a bud type, a dahlia type, a petal-dahlia type or a petal type (a graphene sheet structure) are one-dimensionally connected. That is, it has a structure in which single-walled carbon nanohorns gather in a radial pattern with respect to the central axis of a carbon structure extending in a fibrous form. Accordingly, one or a plurality of these carbon nanohorn aggregates are contained in the fibrous carbon structure. The non-permeating particles in FIGS. 1 and 2 indicate metals present inside the fibrous carbon nanohorn aggregate.

FIG. 3a is a SEM photograph of a fibrous carbon nanohorn aggregate according to one example embodiment of the present invention, FIG. 3b is a scanning transmission electron microscope (STEM) photograph, FIG. 3c is a STEM photograph enlarging the square portion of FIG. 3b, and FIG. 3d is an image view of FIG. 3c. From FIG. 3a, it is understood that a tubular structure having a diameter of several nanometers is connected between columnar structures having a diameter of about 50 nm. The part encircled by the square in FIG. 3b appears to have a part of the fibrous structure broken. From FIG. 3c, it can be seen that there is a tubular structure in the portion surrounded by a square in FIG. 3b. Then, the tubular structure is exposed from the carbon nanohorn aggregate positioned in the lateral direction on the paper surface of FIG. 3c.

Figure 4:
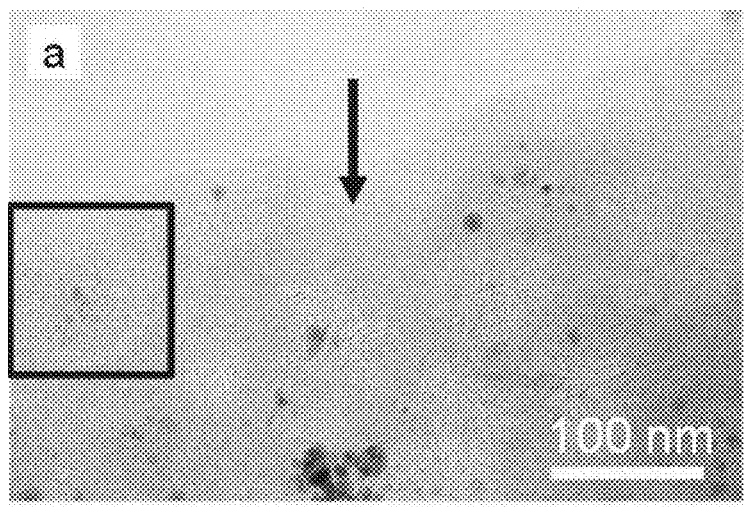
FIG. 4(a) is a transmission electron microscope (TEM) photograph of the cross section of a fibrous carbon nanohorn aggregate according to one embodiment example.
FIG. 4(b) is a TEM photograph enlarging the square portion of FIG. 4(a)
FIG. 4(c) is an image view of the cross section.
Figure 4:
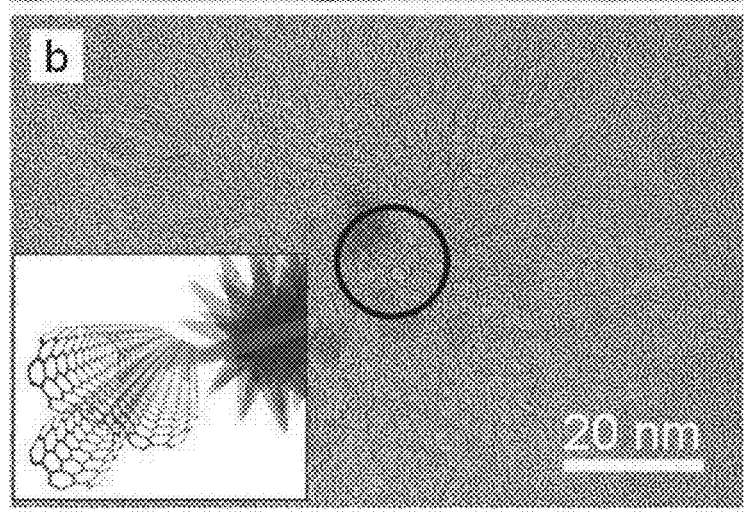
Figure 4:
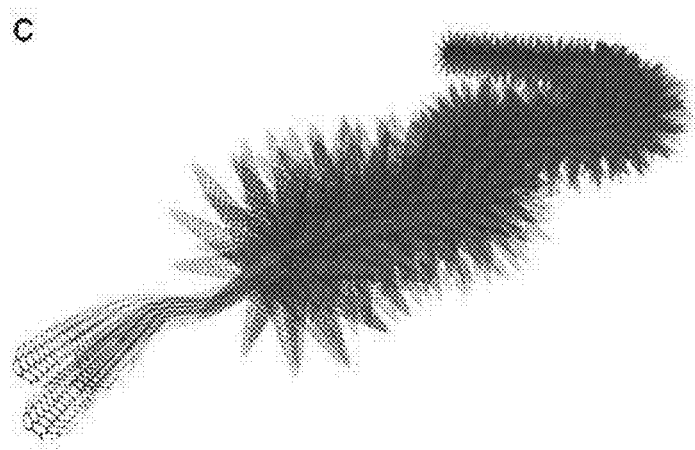

FIGS. 4(a)-(c) show cross-sectional observation image of a fibrous carbon nanohorn aggregate by TEM. The observed sample was obtained by embedding a fibrous carbon nanohorn aggregate with a resin, then, thinning it by Ar ion milling. The portion indicated by the arrow in FIG. 4(a) is a resin. An enlarged view of a portion surrounded by a solid line in FIG. 4a4(a) is shown in FIG. 4b4(b). From FIG. 4(b), a circular structure with a diameter of approximately 2.5 nm is seen. This circular structure is considered to be a hollow columnar structure. In this cross section, a plurality (three) of circular structures can be confirmed, and it is considered that a bundle of single-walled carbon nanotubes exists in a part of the fibrous carbon nanohorn aggregate. FIG. 4(c) shows an image view in which a bundle of single-walled carbon nanotubes that is visible in the cross section of the fibrous carbon nanohorn aggregate is exposed.

From the above, it was confirmed that the fibrous carbon nanohorn aggregate had single-walled carbon nanotubes inside. FIG. 3d shows an image view in which carbon nanotubes are exposed in a part of the fibrous carbon nanohorn aggregate. The fibrous carbon nanohorn aggregate includes carbon nanotubes and a plurality of single-walled carbon nanohorns gathered radially to the side face of the carbon nanotubes. In addition, a plurality of carbon nanotubes are mainly contained discontinuously around the catalyst contained in the fibrous carbon nanohorn aggregate as a nucleus. That is, the fibrous carbon nanohorn aggregate may partially have a structure in which carbon nanohorns gather radially to the side face of the carbon nanotube. In addition, the carbon nanotube may be composed of a single layer or a plurality of layers, or they may be mixed.

Figure 5:
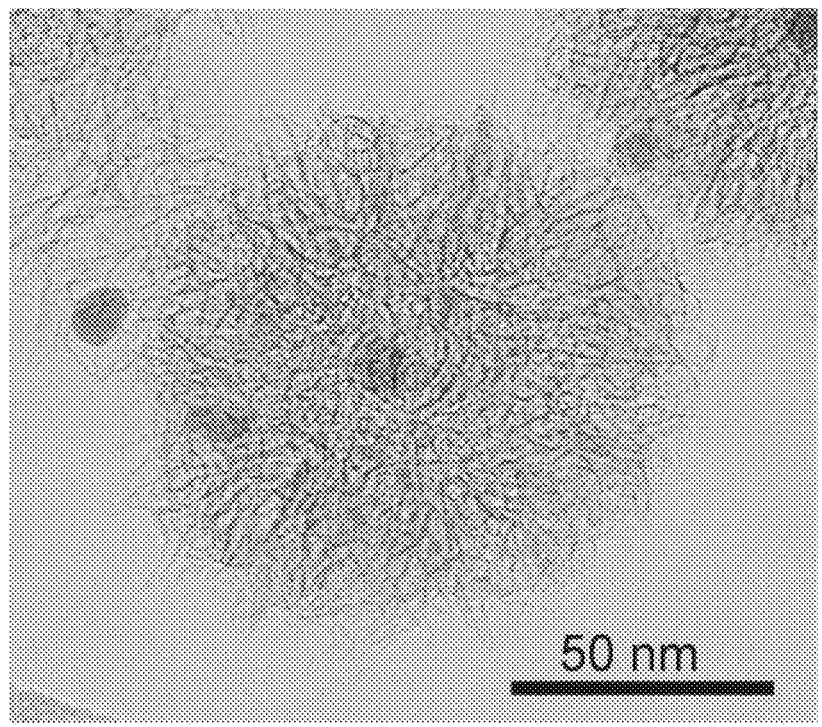
FIG. 5 is a STEM photograph of a spherical carbon nanohorn aggregate prepared according to one embodiment example.

FIG. 5 is a STEM photograph of a spherical carbon nanohorn aggregate produced simultaneously with a fibrous carbon nanohorn aggregate. As will be described later, when a fibrous carbon nanohorn aggregate is produced by the production method according to the present invention, a spherical carbon nanohorn aggregate is produced at the same time. As shown in FIG. 5, the spherical carbon nanohorn aggregate produced simultaneously with the fibrous carbon nanohorn aggregate also has a metal inside.

Figure 6:
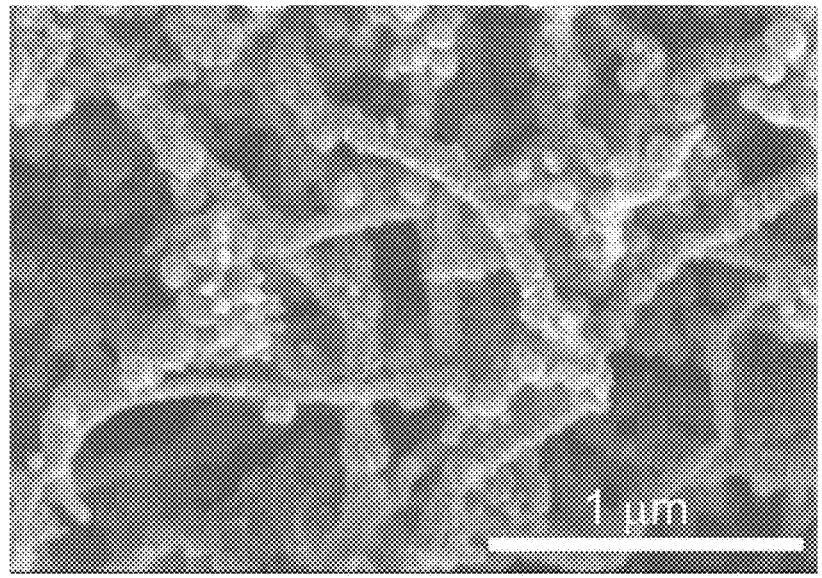
FIG. 6 is a scanning electron microscope (SEM) photograph of a fibrous carbon nanohorn aggregate and a spherical carbon nanohorn aggregate prepared according to one embodiment example.

FIG. 6 is a scanning electron microscope (SEM) photograph of a fibrous carbon nanohorn aggregate and a spherical carbon nanohorn aggregate. Since a fibrous carbon nanohorn aggregate and a spherical carbon nanohorn aggregate are present, this structure is difficult to agglomerate.

The diameter of the single-walled carbon nanohorn is approximately 1 nm to 5 nm, and the length is 30 nm to 100 nm. The fibrous carbon nanohorn aggregate has a diameter of about 30 nm to 200 nm. The length of the fibrous carbon nanohorn aggregate is not particularly limited, but it is about 1 μm to 100 μm. On the other hand, the spherical carbon nanohorn aggregate has a substantially uniform size with a diameter of about 30 nm to 200 nm.

The resulting spherical carbon nanohorn aggregate of a seed type, a bud type, a dahlia type, a petal-dahlia type or a petal type is formed singly or in combination thereof (FIGS. 7(a)-(d)). The seed type has a spherical surface with almost no angular protrusions or no shape at all, the bud type has a spherical surface with some angular protrusions, the dahlia type has a spherical surface with a lot of angular protrusions, and the petal type is a shape in which petal-like protrusions are seen on a spherical surface (graphene sheet structure). The petal-dahlia type is an intermediate structure between the dahlia type and the petal type. The spherical carbon nanohorn aggregate is produced in a state mixed with the fibrous carbon nanohorn aggregate. The morphology and particle diameter of the spherical carbon nanohorn aggregate to be produced can be adjusted by the type and flow rate of the gas.

The fibrous carbon nanohorn aggregate and the spherical carbon nanohorn aggregate can be separated by a centrifugal separation method, by utilizing a difference in sedimentation rate after being dispersed in a solvent, and the like. In order to maintain the dispersibility of the fibrous carbon nanohorn aggregate, it is preferable to use as it is without separation.

The fibrous carbon nanohorn aggregate according to the present example embodiment is not limited only to the above structure as long as the structure of gathering the single-walled carbon nanohorn aggregates in a fibrous form.

A method for producing a fibrous carbon nanohorn aggregate will be described. The carbon containing the catalyst is defined as a target (referred to as a catalyst-containing carbon target). The catalyst-containing carbon target is heated by laser ablation in a nitrogen atmosphere, an inert atmosphere, or a mixed atmosphere while rotating the target in a vessel in which the catalyst-containing carbon target is disposed, to evaporate the target. In the course of cooling of the evaporated carbon and catalyst, a fibrous carbon nanohorn aggregate and a spherical carbon nanohorn aggregate are obtained. In order to evaporate the catalyst-containing carbon target, it is preferable that the catalyst-containing carbon target has low thermal conductivity and is soft (low density). That is, the thermal conductivity is preferably 80 W/(m·K) or less, more preferably 30 W/(m·K). The hardness is preferably 40 (HDS) or more and 80 or less. When a catalyst-containing carbon target having a high thermal conductivity is used, it is preferable to increase the laser power. The amount of the fibrous carbon nanohorn aggregate produced varies depending on the balance between the thermal conductivity and hardness of the catalyst-containing carbon target and the laser power.

Although the method using the catalyst-containing carbon target was partially known as a method for producing carbon nanotubes, and as the conventional carbon nanohorn aggregate (spherical carbon nanohorn aggregate), a pure (100%) graphite target not containing a catalyst has been used. In addition to the above-described laser ablation method, an arc discharge method or a resistance heating method can be used as a manufacturing method. However, the laser ablation method is more preferable from the viewpoint that it can be continuously produced at room temperature and atmospheric pressure.

In the laser ablation (LA) method applied in the present invention, pulsed or continuous irradiation with laser is performed on a target, and when the irradiation intensity becomes equal to or higher than the threshold value, the target converts energy, and as a result, the plume is generated, and the product is deposited on a substrate provided downstream of the target, or is generated in the space inside the device, and collected in a collection chamber.

For laser ablation, $CO_2$ laser, YAG laser, excimer laser and the like can be used, and $CO_2$ laser easily exhibiting high power is most suitable. The $CO_2$ laser can have a power of 1 $kW/cm^2$ to 1000 $kW/cm^2$, and can carry out continuous irradiation and pulsed irradiation. Continuous irradiation is preferable for generating carbon nanohorn aggregates. Laser light is focused by a ZnSe lens or the like and irradiated. In addition, the synthesis can be continuously carried out by rotating the target. Although the target rotation speed can be set arbitrarily, 0.1 to 6 rpm is particularly preferable, if it is slower than 0.1 rpm, it is not preferable because it is easy to graphitize. If it is higher than 6 rpm, amorphous carbon increases, which is not preferable. At this time, the laser power is preferably 15 $kW/cm^2$ or more, most preferably 30 to 300 $kW/cm^2$. If the laser power is less than 15 $kW/cm^2$, the target does not evaporate and it is difficult to synthesize. Although it can be synthesized even if the laser power exceeds 300 $kW/cm^2$, it is unsuitable because the proportion of amorphous carbon increases. However, as described above, when a catalyst-containing carbon target having a high thermal conductivity is used, it is preferable to irradiate the laser with higher power. Although the pressure inside the vessel (chamber) can be used at 3332.2 hPa (10000 Torr) or less, the closer the pressure is to vacuum, the more easily carbon nanotube grows from the catalyst, and the fibrous carbon nanohorn aggregate cannot be obtained. It is also suitable for mass synthesis and cost reduction to use it at a pressure of preferably 666.61 hPa (500 Torr) to 1266.56 hPa (950 Torr), more preferably around atmospheric pressure (1013 hPa (1 atm≈760 Torr)). The irradiation area can also be controlled by the laser power and the degree of convergence by the lens, and 0.01 $cm^2$ to 1 $cm^2$ can be used.

Figure 7:
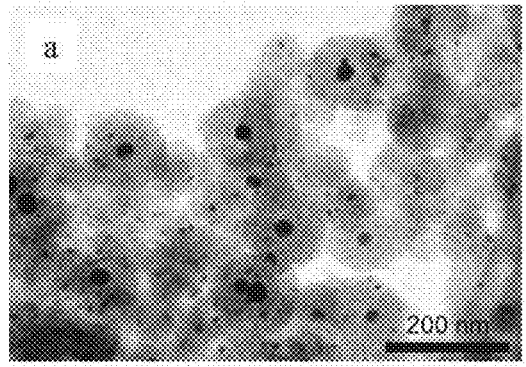
FIGS. 7(a) to (c) are STEM photographs of a spherical carbon nanohorn aggregate prepared according to one embodiment example.
FIG. 7(d) shows the results of EDX.
Figure 7:
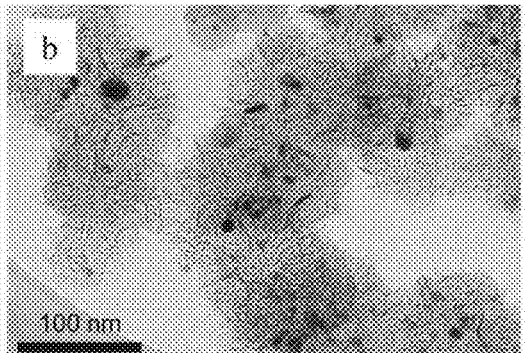
Figure 7:
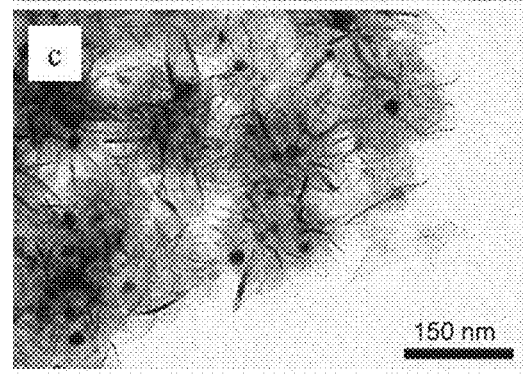
Figure 7:
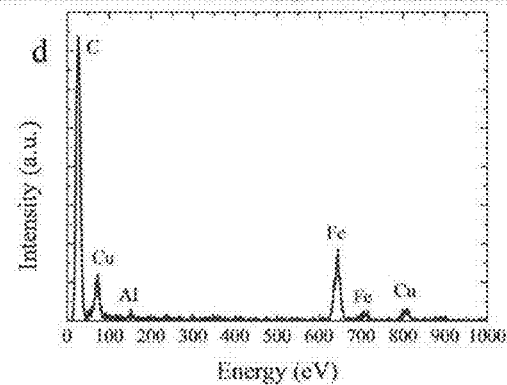

As the catalyst, Fe, Ni and Co can be used singly or as a mixture. These catalytic metals are ferromagnetic materials and are contained in the carbon nanohorn aggregate (both fibrous and spherical) as shown in FIGS. 5, 7 and 9. Therefore, if the amount of the catalyst added to the catalyst-containing carbon target is increased, a carbon nanohorn aggregate containing (including) correspondingly an increased amount of catalyst (ferromagnetic material) is obtained. Since the ferromagnetic material has a structure covered with the carbon nanohorn aggregate, the included ferromagnetic material does not oxidize, and the magnetic function and the like possessed by the ferromagnetic material are hardly degraded.

Although the concentration of the catalyst can be selected appropriately, it is preferably 0.1% by mass to 100% by mass, more preferably 5% by mass to 20% by mass, with respect to carbon. When the content is 0.1% by mass or more, the fibrous carbon nanohorn aggregate is reliably generated. In addition, when the content is 100% by mass or less, an increase in the target cost can be suppressed. By setting the content of the catalyst to 5% by mass or more, the production ratio of a fibrous carbon nanohorn aggregate increases. When the content is 15% by mass or more, the amount of the catalyst contained in the carbon nanohorn aggregate increases and the magnetism strongly appears, so that it can be used as an electromagnetic wave absorbing material without separately adding magnetic material particles. The amount of metals included (including adhesion) in the carbon nanohorn aggregate to be produced is larger as the ratio to carbon than the amount of the catalyst contained in the catalyst-containing carbon target.

In the fibrous carbon nanohorn aggregate and the spherical carbon nanohorn aggregate obtained as described above, a part of the carbon skeleton thereof may be substituted with a catalytic metal element, a nitrogen atom or the like.

It is considered that the fibrous carbon nanohorn aggregate according to the present example embodiment is generated by the following generation mechanism:

That is, (1) the catalyst-containing carbon target is rapidly heated by laser irradiation, whereby carbon and the catalyst are vaporized at once from the target and plume is formed by high-density carbon evaporation. (2) At that time, the carbon forms a carbon droplet of uniform size by a collision with each other. (3) Carbon droplets gradually get cold, graphitization of carbon progresses, and tubular carbon nanohorns are formed in the course of diffusion of carbon droplets. At this time, carbon nanotubes also grow from the catalyst dissolved in the carbon droplets. (4) Using the carbon nanotube as a template, the radial structure of the carbon nanohorn is connected one-dimensionally, and a fibrous carbon nanohorn aggregate is formed.

In the case of forming a fine hole in the carbon nanohorn aggregate (opening), it can be carried out by an oxidation treatment. By this oxidation treatment, a surface functional group containing oxygen is formed on the opening portion. In addition, the oxidation treatment can use a gas phase process and a liquid phase process. In the case of a gas phase process, the heat treatment is performed in an atmosphere gas containing oxygen such as air, oxygen, carbon dioxide and the like. Among them, air is suitable from the viewpoint of cost. The temperature can be in the range of 300 to 650° C., and 400 to 550° C. is more suitable. At 300° C. or higher, there is no concern that carbon cannot burn and the hole cannot be formed. Further, at 650° C. or lower, it is possible to suppress the entire carbon nanohorn aggregate from burning. In the case of a liquid phase process, it is carried out in a liquid containing an oxidizing substance such as nitric acid, sulfuric acid, hydrogen peroxide or the like. In the case of nitric acid, it can be used in the temperature range from room temperature to 120° C. When the temperature is 120° C. or lower, the oxidizing power never becomes too high and the oxidation never occurs than necessary. In the case of hydrogen peroxide, it can be used in the temperature range of room temperature to 100° C., and 40° C. or higher is preferable. In the temperature range of 40° C. to 100° C., the oxidizing power efficiently acts and can efficiently form openings. Further, in the case of the liquid process, combined use with light irradiation is more effective.

It is preferable that the catalytic metal contained at the time of forming the carbon nanohorn aggregate is used as the ferromagnetic material as it is as the electromagnetic wave absorbing material according to the present example embodiment. However, in the case of forming the above-described openings, the catalytic metal is preferably removed before the oxidation treatment. The catalytic metal can be removed since it dissolves in nitric acid, sulfuric acid and hydrochloric acid. From the viewpoint of ease of use, hydrochloric acid is suitable. Although the temperature at which the catalyst is dissolved can be selected as appropriate, in the case of sufficiently removing the catalyst, it is desirable to heat it at 70° C. or higher. In the case of using nitric acid or sulfuric acid, removal of the catalyst and formation of openings can be carried out simultaneously or successively. In addition, since the catalyst may be covered with the carbon coating at the time of forming the carbon nanohorn aggregate, it is preferable to perform a pretreatment to remove the carbon coating. The pretreatment is preferably carried out in air at about 250 to 450° C.

Further, the ferromagnetic material can be included again in the carbon nanohorn aggregate after the opening treatment. In that case, a carbon nanohorn aggregate is dispersed in a solution in which a metal salt of a ferromagnetic material (Fe, Ni, Co or the like) is dissolved, and then, a heat treatment is performed to obtain a carbon nanohorn aggregate including a metal or a metal compound. The heat treatment can be performed at a temperature of around 900° C. The metal compound can also be converted to a metal by heat treatment at higher temperature. Here, the deposited metal particles are not limited to those included in the carbon nanohorn aggregate, but also those adhered to the outside of the carbon nanohorn aggregate are mentioned.

The resulting carbon nanohorn aggregate can be improved in crystallinity by a heat treatment in a non-oxidizing atmosphere such as an inert gas, hydrogen, or vacuum. The heat treatment temperature can be 800 to 2000° C., preferably 1000 to 1500° C. After the opening treatment, a surface functional group containing oxygen is formed on the opening portion, but it can also be removed by a heat treatment. The heat treatment temperature can be 150 to 2000° C. In order to remove the surface functional group such as a carboxyl group, a hydroxyl group and the like, it is desirable that the temperature is 150° C. to 600° C. The carbonyl group or the like as the surface functional group is desirably heated at 600° C. or higher. Also, the surface functional groups can be removed by reduction in a gas or liquid atmosphere. For reduction in a gaseous atmosphere, hydrogen can be used and it can be used simultaneously for improving the above-mentioned crystallinity. In a liquid atmosphere, hydrazine and the like can be used.

The mixture of the fibrous carbon nanohorn aggregates and the spherical carbon nanohorn aggregates (hereinafter also referred to as carbon nanohorn aggregate mixture) can be used as it is or after isolating the fibrous carbon nanohorn aggregate, or after forming an opening, it can be used as an electromagnetic wave absorbing material. Preferably, the carbon nanohorn aggregate mixture is used as it is.

When used as an electromagnetic wave absorbing material, a single body of Fe, Ni or Co or a mixture thereof, particles of an alloy containing at least one of these metals and one or more elements selected from the group consisting of Al, Mg, Mo, B, Si, Sr and Nb, particles of other known magnetic materials, and the like, can be added, in addition to the ferromagnetic material (catalyst) to be included, to enhance magnetic permeability.

Further, the electromagnetic wave absorbing material according to the present example embodiment may contain various polymer materials (thermoplastic resin, thermosetting resin, elastomer such as rubber). Alternatively, a carbon nanohorn aggregate containing a catalyst component in these polymer materials as the base material, and optionally, other magnetic material particles can be kneaded, to form a sheet-like or film-like composite material. Such a composite material can impart not only electromagnetic wave absorptivity but also electrical or thermal conductivity and strength.

It is also possible to use it as an electromagnetic wave absorbing material as a nano-carbon composite in which one or a plurality of carbon nanotubes, carbon fibers, graphene, carbon black, fullerene, graphite and amorphous carbon are mixed in the carbon nanohorn aggregate mixture.

The carbon nanohorn aggregate containing the catalyst component can be optionally used as an electromagnetic wave shield by dispersing it in an appropriate solvent together with other magnetic material particles and a binder to prepare a paste or paint and coating it inside the housing of the electronic equipment. It can also be applied to a cloth or a resin sheet to form an electromagnetic wave absorption sheet. Since the fibrous carbon nanohorn aggregate has high dispersibility unlike the conventional fibrous substance, other substances and the like can be easily mixed. Furthermore, since the fibrous carbon nanohorn aggregate prevents re-agglomeration during drying after coating with a paste or the like mixed with a solvent or the like, a coating film excellent in uniformity can be formed.

The electromagnetic wave absorbing material according to the present example embodiment also exhibits an antistatic function due to the high conductivity of the fibrous carbon nanohorn aggregate. In addition, a fibrous carbon nanohorn aggregate has excellent thermal conductivity, thus, heat generated by electromagnetic wave absorption can be dispersed immediately.

EXAMPLES

Examples will be shown below, and the present invention will be exemplified and explained in more detail. Of course, the invention is not limited by the following examples.

Example 1

A catalyst-containing carbon target containing iron was placed in a vessel. The interior of the vessel was brought to a nitrogen atmosphere. While rotating the catalyst-containing carbon target at 2 rpm, the target was irradiated with $CO_2$ gas laser light. Under a nitrogen atmosphere, the catalyst-containing carbon target containing iron was subjected to $CO_2$ laser ablation, to prepare a fibrous carbon nanohorn aggregate and a spherical carbon nanohorn aggregate (Sample 1). Details of the experiment are shown below. The catalyst-containing carbon target placed in the reaction vessel was rotated at 2 rpm. $CO_2$ laser having an energy density of 100 to 300 $kW/cm^2$ was continuously irradiated to the target. The temperature inside the reaction vessel was room temperature. Inside the reaction vessel, the gas flow rate was adjusted to be 10 L/min. The pressure was controlled to 933.254 to 1266.559 hPa (700 to 950 Torr).

Example 2

A catalyst-containing carbon target containing 0.5% by mass of iron was used as a raw material. The other conditions are the same as in Example 1.

Example 3

A catalyst-containing carbon target containing 1.5% by mass of iron was used as a raw material. The other conditions are the same as in Example 1.

Example 4

A catalyst-containing carbon target containing 5% by mass of iron was used as a raw material. The other conditions are the same as in Example 1.

Example 5

A catalyst-containing carbon target containing 15% by mass of iron was used as a raw material. The other conditions are the same as in Example 1.

Comparative Example 1

A sample was prepared under a nitrogen atmosphere using a graphite target not containing a catalyst. The other conditions are the same as in Example 1.

FIG. 6 is an SEM photograph of Sample 1 prepared in Example 1. Fibrous and spherical substances were observed. The fibrous substance had a diameter of about 30 to 100 nm and a length of several μm to several 10 μm. The spherical substance occupied mostly those of uniform size in the range of the diameter of about 30 to 200 nm. FIGS. 1, 2, 5 and 7 are STEM photographs of the product. From the observation results in FIGS. 1 and 2, it was found that single-walled carbon nanohorns having a diameter of 1 to 5 nm and a length of about 40 to 50 nm gathered in a fibrous form in the fibrous substance. In addition, from the observation results in FIGS. 5 and 7a to 7c, it was found that the spherical substance was a mixture of carbon nanohorn aggregates of a seed type, a bud type, a dahlia type and a petal-dahlia type. The result of analyzing black particles by EDX (energy dispersive X-ray spectroscopy) is shown in FIG. 7d. Mainly carbon and iron were detected. Iron particles were predominantly present in the central part of the aggregate, but it was also present at a position deviated from the center.

Figure 8:
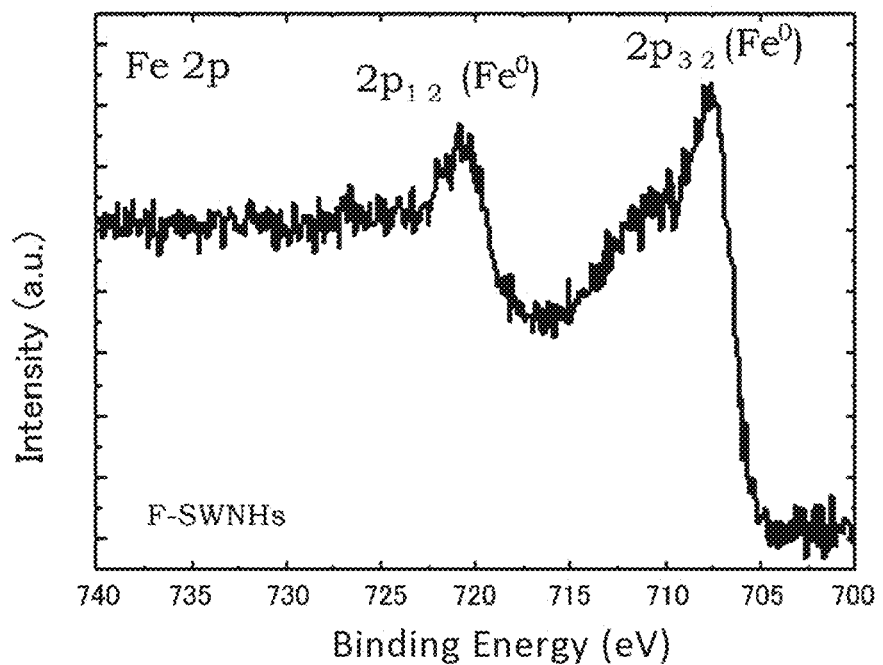
FIG. 8 shows XPS results of a fibrous carbon nanohorn aggregate and a spherical carbon nanohorn aggregate prepared according to one embodiment example.

FIG. 8 shows XPS (X-ray photoelectron spectroscopy) results of Sample 1. From the position of the Fe2p spectrum, iron was found to be zero valence, and it was found that carbides and oxides were not formed.

In FIGS. 9(a)-(d), FIG. 9(a) is a scanning electron microscopy (SEM) photography of a sample prepared using a catalyst-containing carbon target having a Fe content of 5% by mass (Example 4), FIG. 9(b) shows Z contrast, FIG. 9(c) is a scanning transmission electron microscopy (STEM) photograph, and (d) shows the results of STEM observation. From the SEM observation, a cylindrical structure with a length of 5-10 μm was observed. The white particles in FIG. 9(b) are Fe and have a size distribution of 5 to 30 nm. FIG. 9(c) is the result of enlarged observation of the cylindrical structure of FIG. 9(a), which was found to be a fibrous carbon nanohorn aggregate. The surrounding spherical structure is a spherical carbon nanohorn aggregate. FIG. 9(d) is an enlarged image of the tip portion of the cylindrical structure of FIG. 9(a), which was found to be a fibrous carbon nanohorn aggregate from the end to the end.

FIGS. 10(a)-(e) show SEM images of a sample prepared using a catalyst-containing carbon target in which the Fe content was FIG. 10(a) 0% by mass (Comparative Example 1), FIG. 10(b) 0.5% by mass (Example 2), FIG. 10(c) 1.5% by mass (Example 3), FIG. 10(d) 5% by mass (Example 4) and FIG. 10(e) 15% by mass (Example 5).

When iron is not contained at all in Comparative Example 1, only a spherical carbon nanohorn aggregate is produced. In the case of Examples 2 and 3, a fibrous carbon nanohorn aggregate is slightly formed. In the case of Example 4, a fibrous carbon nanohorn aggregate is produced in large quantities. In the case of Example 5, a fibrous carbon nanohorn aggregate was produced in a large amount, and the included Fe fine particles increased, and the electromagnetic wave absorbability appeared.

SUPPLEMENTAL NOTE

The present invention includes the following embodiments.

(Note 1)

An electromagnetic wave absorbing material characterized by containing a fibrous carbon nanohorn aggregate composed of a plurality of single-walled carbon nanohorns gathering in a fibrous form.

(Note 2)

The electromagnetic wave absorbing material according to Note 1, wherein the fibrous carbon nanohorn aggregate contains carbon nanotubes inside.

(Note 3)

The electromagnetic wave absorbing material according to Note 1 or 2, wherein the fibrous carbon nanohorn aggregate has a diameter of 30 nm to 200 nm and a length of 1 μm to 100 μm.

(Note 4)

The electromagnetic wave absorbing material according to any one of Notes 1 to 3, wherein each single-walled carbon nanohorn has a diameter of 1 nm to 5 nm and a length of 30 nm to 100 nm, and has a horn-shaped tip.

(Note 5)

The electromagnetic wave absorbing material according to any one of Notes 1 to 4, wherein the fibrous carbon nanohorn aggregate is one in which at least one kind of carbon nanohorn aggregate of a seed type, a dahlia type, a bud type, a petal dahlia type or a petal type is connected in a fibrous form.

(Note 6)

The electromagnetic wave absorbing material according to any one of Notes 1 to 5, further comprising at least one spherical carbon nanohorn aggregate of a seed type, a bud type, a dahlia type, a petal dahlia type or a petal type, not constituting the fibrous carbon nanohorn aggregate.
(Note 7)
The electromagnetic wave absorbing material according to any one of Notes 1 to 6, wherein a part of each single-walled carbon nanohorn has an opening.
(Note 8)
The electromagnetic wave absorbing material according to any one of Notes 1 to 7, wherein the fibrous carbon nanohorn aggregate includes particles of a magnetic material selected from a single body of Fe, Ni or Co or a mixture thereof.
(Note 9)
The electromagnetic wave absorbing material according to any one of Notes 1 to 8, wherein particles of a magnetic material selected from a single body of Fe, Ni or Co or a mixture thereof or an alloy containing at least one of these metals and one or more elements selected from the group consisting of Al, Mg, Mo, B, Si, Sr and Nb are contained outside the fibrous carbon nanohorn aggregate.
(Note 10)
The electromagnetic wave absorbing material according to any one of Notes 1 to 9, containing a polymer material.
(Note 11)
An electromagnetic wave absorbing paint containing the electromagnetic wave absorbing material according to any one of Notes 1 to 10 and a solvent.
(Note 12)
A sheet or film containing the electromagnetic wave absorbing material according to any one of Notes 1 to 10.
(Note 13)
An article coated with the electromagnetic wave absorbing paint according to Note 11.
(Note 14)
A process for producing the fibrous carbon nanohorn aggregate contained in the electromagnetic wave absorbing material according to any one of Notes 1 to 10, comprising
a step of bringing the atmosphere in a vessel in which a catalyst-containing carbon target containing 15% by mass or more of a single body of Fe, Ni or Co or a mixture thereof is disposed into an inert gas atmosphere, a nitrogen gas atmosphere or a mixed atmosphere,
a step of evaporating the target by laser ablation while rotating the target, and
a step of controlling the gas flow rate constant in the process of evaporating the target.
(Note 15)
A fibrous carbon nanohorn aggregate containing carbon nanotubes and a plurality of single-walled carbon nanohorns gathered radially to the side face of the carbon nanotubes.
(Note 16)
The fibrous carbon nanohorn aggregate according to Note 15, wherein the carbon nanotube contains a bundle composed of a plurality of single-walled carbon nanotubes.

INDUSTRIAL APPLICABILITY

The electromagnetic wave absorbing material of the present embodiment can be applied to electromagnetic wave shield (EMI shield) capable of absorbing, reflecting or transmitting electromagnetic waves, and various antennas.

The invention claimed is:
1. An electromagnetic wave absorbing material characterized by comprising a fibrous carbon nanohorn aggregate composed of a plurality of single-walled carbon nanohorns gathering in a fibrous form.

2. The electromagnetic wave absorbing material according to claim 1, wherein said fibrous carbon nanohorn aggregate contains carbon nanotubes inside.

3. The electromagnetic wave absorbing material according to claim 1, wherein the fibrous carbon nanohorn aggregate has a diameter of 30 nm to 200 nm and a length of 1 μm to 100 μm.

4. The electromagnetic wave absorbing material according to claim 1, wherein each single-walled carbon nanohorn has a diameter of 1 nm to 5 nm and a length of 30 nm to 100 nm, and has a horn-shaped tip.

5. The electromagnetic wave absorbing material according to claim 1, wherein the fibrous carbon nanohorn aggregate is one in which at least one kind of carbon nanohorn aggregate of a seed type, a dahlia type, a bud type, a petal dahlia type or a petal type is connected in a fibrous form.

6. The electromagnetic wave absorbing material according to claim 1, further comprising at least one spherical carbon nanohorn aggregate of a seed type, a bud type, a dahlia type, a petal dahlia type or a petal type, not constituting the fibrous carbon nanohorn aggregate.

7. The electromagnetic wave absorbing material according to claim 1, wherein a part of each single-walled carbon nanohorn has an opening.

8. The electromagnetic wave absorbing material according to claim 1, wherein the fibrous carbon nanohorn aggregate includes particles of a magnetic material selected from a single body of Fe, Ni or Co or a mixture thereof.

9. The electromagnetic wave absorbing material according to claim 1, wherein particles of a magnetic material selected from a single body of Fe, Ni or Co or a mixture thereof or an alloy containing at least one of these metals and one or more elements selected from the group consisting of Al, Mg, Mo, B, Si, Sr and Nb are contained outside the fibrous carbon nanohorn aggregate.

10. The electromagnetic wave absorbing material according to claim 1, comprising a polymer material.

11. An electromagnetic wave absorbing paint containing the electromagnetic wave absorbing material according to claim 1 and a solvent.

12. A sheet or film containing the electromagnetic wave absorbing material according to claim 1.

13. An article coated with the electromagnetic wave absorbing paint according to claim 11.

14. A process for producing the fibrous carbon nanohorn aggregate contained in the electromagnetic wave absorbing material according to claim 1, comprising
a step of bringing the atmosphere in a vessel in which a catalyst-containing carbon target containing 15% by mass or more of a single body of Fe, Ni or Co or a mixture thereof is disposed into an inert gas atmosphere, a nitrogen gas atmosphere or a mixed atmosphere,
a step of evaporating the target by laser ablation while rotating the target, and
a step of controlling the gas flow rate constant in the process of evaporating the target.

15. A fibrous carbon nanohorn aggregate comprising a plurality of carbon nanotubes and a plurality of single-walled carbon nanohorns, wherein the plurality of carbon nanotubes is contained discontinuously inside the fibrous carbon nanohorn aggregate and the plurality of single-walled carbon nanohorns is gathered radially to the side face of the carbon nanotubes.

16. The fibrous carbon nanohorn aggregate according to claim 15, wherein the carbon nanotube contains a bundle composed of a plurality of single-walled carbon nanotubes.

\* \* \* \* \*